US010644235B2

(12) United States Patent
El-Hinnawy et al.

(10) Patent No.: US 10,644,235 B2
(45) Date of Patent: May 5, 2020

(54) PHASE-CHANGE MATERIAL (PCM) RADIO FREQUENCY (RF) SWITCH WITH REDUCED PARASITIC CAPACITANCE

(71) Applicant: Newport Fab, LLC, Newport Beach, CA (US)

(72) Inventors: Nabil El-Hinnawy, Irvine, CA (US); Gregory P. Slovin, Irvine, CA (US); Jefferson E. Rose, Hawthorne, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 23 days.

(21) Appl. No.: 16/161,960

(22) Filed: Oct. 16, 2018

(65) Prior Publication Data
US 2020/0058848 A1 Feb. 20, 2020

Related U.S. Application Data

(63) Continuation-in-part of application No. 16/114,106, filed on Aug. 27, 2018, and a continuation-in-part of
(Continued)

(51) Int. Cl.
*H01L 45/00* (2006.01)
*H01L 27/24* (2006.01)

(52) U.S. Cl.
CPC .......... *H01L 45/06* (2013.01); *H01L 27/2463* (2013.01); *H01L 45/1226* (2013.01);
(Continued)

(58) Field of Classification Search
CPC ... H01L 45/06; H01L 45/144; H01L 45/1286; H01L 45/1233; H01L 45/126
See application file for complete search history.

(56) References Cited

U.S. PATENT DOCUMENTS 5,976,932 A * 11/1999 Kerber ............. H01L 29/42324
438/257
6,448,576 B1 * 9/2002 Davis ................. H01L 23/5256
257/50
(Continued)

FOREIGN PATENT DOCUMENTS

WO WO 2016/028362 2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.
(Continued)

*Primary Examiner* — Jaehwan Oh
(74) *Attorney, Agent, or Firm* — Farjami & Farjami LLP (57) ABSTRACT

A reduced parasitic capacitance radio frequency (RF) switch includes a phase-change material (PCM) and a heating element underlying an active segment of the PCM and extending outward and transverse to the PCM. A PCM contact connects a PCM routing interconnect with a passive segment of the PCM, wherein the passive segment extends outward and is transverse to the heating element. A heating element contact connects a heating element routing interconnect with a terminal segment of the heating element. The heating element contact is situated cross-wise to the PCM contact. The heating element routing interconnect is situated at a different interlayer metal level relative to the PCM routing interconnect so as to achieve the reduced parasitic capacitance. The heating element routing interconnect can be situated above the heating element. Alternatively, the heating element routing interconnect can be situated below the heating element.

20 Claims, 11 Drawing Sheets

Related U.S. Application Data application No. 16/103,490, filed on Aug. 14, 2018, now Pat. No. 10,476,001, and a continuation-in-part of application No. 16/103,646, filed on Aug. 14, 2018, now Pat. No. 10,475,993.

(52) U.S. Cl.
CPC ...... *H01L 45/1253* (2013.01); *H01L 45/1286* (2013.01); *H01L 45/144* (2013.01)

(56) References Cited

U.S. PATENT DOCUMENTS

| | | | | |
|---|---|---|---|---|
| 7,522,029 | B1* | 4/2009 | Lantz | B81B 3/0072 337/139 |
| 8,077,504 | B2* | 12/2011 | Li | G11C 13/0004 257/2 |
| 8,314,983 | B2* | 11/2012 | Frank | B81B 3/0072 359/221.1 |
| 9,257,647 | B2 | 2/2016 | Borodulin | |
| 9,362,492 | B2 | 6/2016 | Goktepeli | |
| 9,368,720 | B1* | 6/2016 | Moon | H01L 45/1286 |
| 9,640,759 | B1* | 5/2017 | Curioni | H01L 45/149 |
| 9,891,112 | B1* | 2/2018 | Abel | G01J 5/0853 |
| 9,917,104 | B1* | 3/2018 | Roizin | H01L 27/1203 |
| 2005/0127348 | A1* | 6/2005 | Horak | H01L 45/06 257/3 |
| 2006/0246712 | A1* | 11/2006 | Kim | H01L 27/2427 438/622 |
| 2007/0075347 | A1* | 4/2007 | Lai | H01L 45/06 257/296 |
| 2007/0235708 | A1* | 10/2007 | Elmegreen | H01L 45/06 257/3 |
| 2010/0084626 | A1* | 4/2010 | Delhougne | H01L 27/2436 257/4 |
| 2010/0238720 | A1* | 9/2010 | Tio Castro | H01L 45/06 365/163 |
| 2010/0258777 | A1* | 10/2010 | Li | G11C 13/0004 257/2 |
| 2012/0224406 | A1* | 9/2012 | Chung | G11C 17/06 365/96 |
| 2013/0187120 | A1* | 7/2013 | Redaelli | H01L 45/06 257/5 |
| 2013/0285000 | A1* | 10/2013 | Arai | H01L 45/128 257/3 |
| 2014/0191181 | A1* | 7/2014 | Moon | H01L 27/2409 257/4 |
| 2014/0264230 | A1* | 9/2014 | Borodulin | H01L 45/126 257/4 |
| 2015/0090949 | A1* | 4/2015 | Chang | H01L 45/1253 257/4 |
| 2016/0035973 | A1* | 2/2016 | Raieszadeh | H01L 45/06 257/4 |
| 2016/0056373 | A1* | 2/2016 | Goktepeli | H01L 45/1608 257/2 |
| 2016/0071653 | A1* | 3/2016 | Lamorey | H05B 3/023 361/282 |
| 2016/0308507 | A1* | 10/2016 | Engelen | H02N 11/00 |
| 2017/0092694 | A1* | 3/2017 | BrightSky | H01L 27/2463 |
| 2017/0187347 | A1* | 6/2017 | Rinaldi | H03H 9/205 |
| 2017/0365427 | A1* | 12/2017 | Borodulin | H01L 45/06 |
| 2018/0005786 | A1* | 1/2018 | Navarro | H01P 1/127 |
| 2018/0194615 | A1* | 7/2018 | Nawaz | B81B 7/0035 |
| 2018/0269393 | A1* | 9/2018 | Zhang | H01L 45/1233 |
| 2019/0064555 | A1* | 2/2019 | Hosseini | G02F 1/0147 |
| 2019/0067572 | A1* | 2/2019 | Tsai | H01L 45/1286 |
| 2019/0172657 | A1* | 6/2019 | Zhu | G01K 5/56 |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," 2013 *IEEE Compound Semiconductor Integrated Circuit Symposium (CSICS)*, Monterey, CA, 2013, pp. 1-4.

* cited by examiner

PHASE-CHANGE MATERIAL (PCM) RADIO FREQUENCY (RF) SWITCH WITH REDUCED PARASITIC CAPACITANCE

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material." The present application is also a continuation-in-part of and claims the benefit of and priority to application Ser. No. 16/103,646 filed on Aug. 14, 2018, titled "PCM RF Switch Fabrication with Subtractively Formed Heater." The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element." The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds.

Heating elements in PCM RF switches and connections for the heating elements often create parasitics associated with RF frequencies, and result in performance tradeoffs. Fabricating connections for both PCM and heating elements without significant RF performance tradeoffs, such as tradeoffs involving insertion loss and OFF state parasitic capacitance ($C_{OFF}$), becomes complex, especially where the RF switch is designed primarily around thermal performance. Accordingly, accommodating PCM in RF switches can present significant manufacturing challenges. Specialty manufacturing is often impractical, and large scale manufacturing generally trades practicality for the ability to control device characteristics and critical dimensions.

Thus, there is a need in the art to simply and reliably manufacture low parasitics PCM RF switches, and in particular RF switches with reduced insertion loss and reduced OFF state parasitic capacitance ($C_{OFF}$).

SUMMARY

The present disclosure is directed to phase-change material (PCM) radio frequency (RF) switches with reduced parasitic capacitance, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
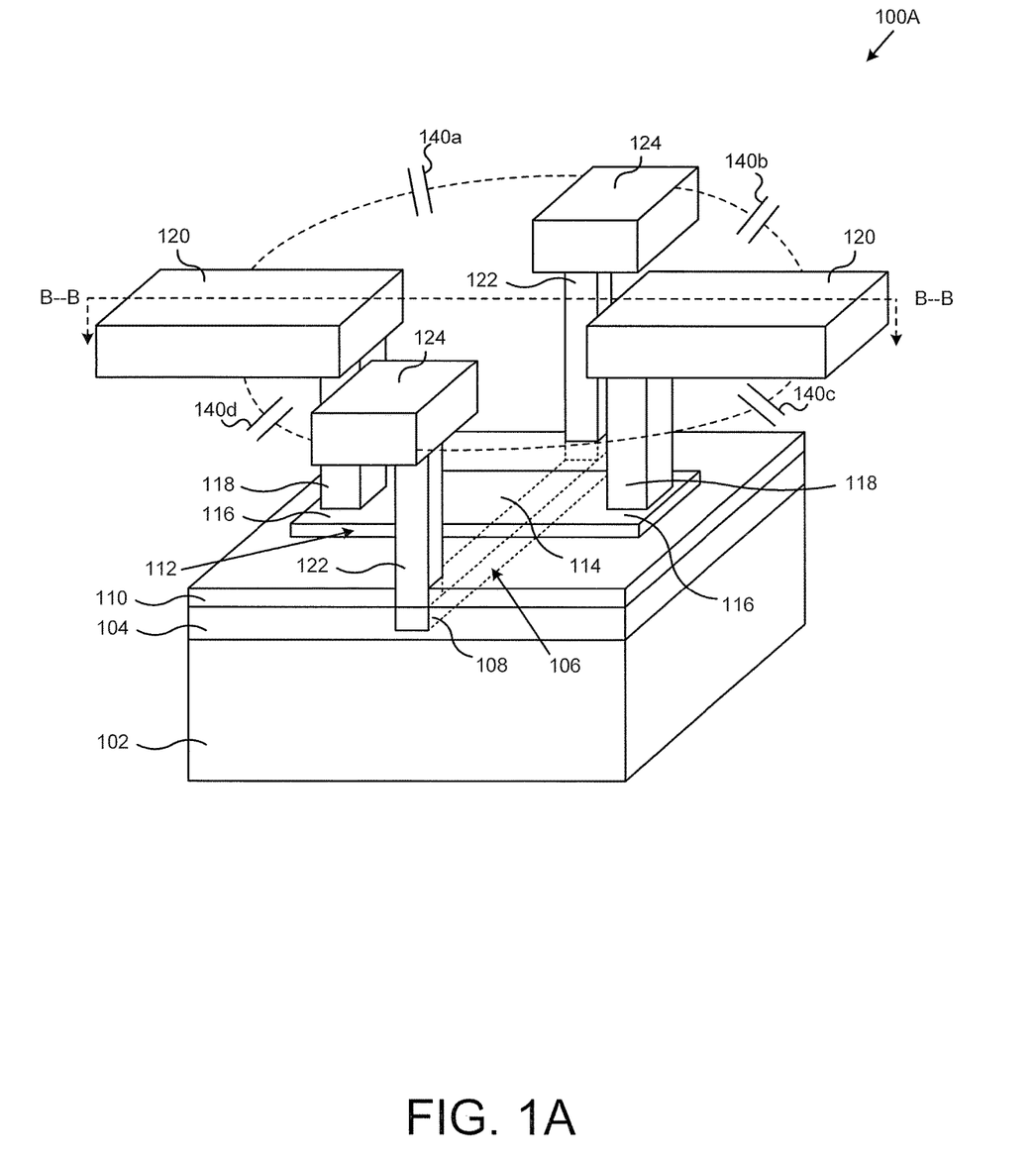
FIG. 1A illustrates a perspective view of a portion of a phase-change material (PCM) radio frequency (RF) switch according to one implementation of the present application.

FIG. 1A illustrates a perspective view of a portion of a phase-change material (PCM) radio frequency (RF) switch according to one implementation of the present application. As shown in FIG. 1A, PCM RF switch 100A includes back-end-of-line multi-level metallization (BEOL MLM) 102, lower dielectric 104, heating element 106 having terminal portions 108, thermally conductive and electrically insulating material 110, PCM 112 having active segment 114 and passive segments 116, PCM contacts 118, PCM routing interconnects 120, heating element contacts 122, heating element routing interconnects 124, and parasitic capacitors 140a, 140b, 140c, and 140d, collectively referred to as parasitic capacitors 140. For purposes of illustration, the perspective view in FIG. 1A shows selected structures of PCM RF switch 100A. PCM RF switch 100A may include other structures not shown in FIG. 1A.

BEOL MLM 102 is generally any multi-layer stack of interconnect metals and interlayer dielectrics suitable for semiconductor devices. BEOL MLM 102 can comprise a plurality of interconnect metal levels and interlayer dielectric layers. BEOL MLM 102 can also comprise a plurality of devices, such as integrated passive devices (not shown in FIG. 1A). In one implementation, a heat spreader (not shown in FIG. 1A) is integrated with substrate BEOL MLM 102. The heat spreader can comprise any material with high thermal conductivity. In one implementation, the heat spreader can comprise a material with both high thermal conductivity and high electrical resistivity. In various implementations, the heat spreader can comprise silicon (Si), aluminum nitride (AlN), aluminum oxide ($Al_XO_Y$), beryllium oxide ($Be_XO_Y$), silicon carbide (SiC), diamond, or diamond-like carbon.

Lower dielectric 104 in PCM RF switch 100A is situated on top of BEOL MLM 102. As shown in FIG. 1A, lower dielectric 104 is also adjacent to sides of heating element 106. Lower dielectric 104 may comprise a material with thermal conductivity lower than that of thermally conductive and electrically insulating material 110. In various implementations, lower dielectric 104 can comprise silicon oxide ($SiO_2$) silicon nitride (SiN), or another dielectric. In various implementations, lower dielectric 104 can have a relative thickness greater or less than shown in FIG. 1A.

Heating element 106 in PCM RF switch 100A is situated in lower dielectric 104. Heating element 106 also underlies PCM 112. Heating element 106 generates a crystallizing pulse or an amorphizing pulse for transforming active segment 114 of PCM 112. Heating element 106 can comprise any material capable of Joule heating. Heating element 106 can be connected to electrodes of a current source (not shown in FIG. 1A) that generates a crystallizing pulse or an amorphizing pulse. Preferably, heating element 106 comprises a material that exhibits minimal electromigration or substantially no electromigration. In various implementations, heating element 106 can comprise a metal such as tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 106 comprises tungsten lined with titanium and titanium nitride. In one implementation, a heat spreader (not shown in FIG. 1A) is integrated with BEOL MLM 102 underlying heating element 106 and dissipates excess heat generated by heating element 106 after a heat pulse, such as a crystallizing pulse or an amorphizing pulse, has transformed the state of the PCM switch to an ON state or an OFF state.

Thermally conductive and electrically insulating material 110 in PCM RF switch 100A is situated on top of heating element 106 and lower dielectric 104, and under PCM 112 and, in particular, under active segment 114 of PCM 112. Thermally conductive and electrically insulating material 110 ensures efficient heat transfer between heating element 106 and active segment 114 of PCM 112, while impeding electrical signals from leaking out from the path between PCM contacts 118 to heating element 106 or to other neighboring structures. Thermally conductive and electrically insulating material 110 can comprise any material with high thermal conductivity and high electrical resistivity. In various implementations, thermally conductive and electrically insulating material 110 can comprise aluminum nitride (AlN), aluminum oxide ($Al_XO_Y$), beryllium oxide ($Be_XO_Y$), silicon carbide (SiC), diamond, or diamond-like carbon.

PCM 112 in PCM RF switch 100A is situated on top of thermally conductive and electrically insulating material 110. PCM 112 includes active segment 114 and passive segments 116. Active segment 114 of PCM 112 approximately overlies heating element 106. Passive segments 118 of PCM 112 extend outward and are transverse to heating element 106, and are situated approximately under PCM contacts 118. As used herein, "active segment" refers to a segment of PCM that transforms between crystalline and amorphous states, for example, in response to a crystallizing or an amorphizing heat pulse, whereas "passive segment" refers to a segment of PCM that does not make such transformation and maintains a crystalline state (i.e., maintains a conductive state). With proper heat pulses and heat dissipation, active segment 114 of PCM 112 can transform between crystalline and amorphous states, allowing PCM RF switch 110A to switch between ON and OFF states respectively.

PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1A, heating element 106 extends outwards and is transverse to PCM 112. Heating element 106 is illustrated with dashed lines as seen through various structures of PCM RF switch 100A. Current flowing in heating element 106 flows substantially under active segment 114 of PCM 112.

PCM contacts 118 in PCM RF switch 100A are connected to passive segments 116 of PCM 112. Similarly, heating element contacts 122 are connected to terminal segments 108 of heating element 106. A described below, PCM contacts 118 and heating element contacts 122 extend through various interlayer metal levels (not shown in FIG. 1A). In various implementations, PCM contacts 118 and heating element contacts 122 can comprise tungsten (W), copper (Cu), or aluminum (Al). In one implementation, PCM contacts 118 and heating element contacts 122 can each comprise a single metal segment in the lowest interlayer metal level. In another implementation, PCM contacts 118 and heating element contacts 122 can each comprise a plurality of intermediate metal segments comprising different interlayer metal levels as well as segments in the lowest interlayer metal level.

PCM routing interconnects 120 in PCM RF switch 100A are connected to PCM contacts 118. Similarly, heating element routing interconnects 124 are connected to heating element contacts 122. PCM routing interconnects 120 route RF signals from/to an external connection to/from PCM 112 through PCM contacts 118. Similarly, heating element routing interconnects 124 route electrical pulses from an external connection to heating element 106 through heating element contacts 122. As shown in FIG. 1A, in the present implementation, PCM routing interconnects 120 and heating element routing interconnects 124 are situated at the same interlayer metal level. In other words, PCM contacts 118 and heating element contacts 122 connect to respective metal segments that are situated in the same interlayer metal level. In various implementations, PCM routing interconnects 120 and heating element routing interconnects 124 can comprise Cu or Al. PCM routing interconnects 120 and heating element routing interconnects 124 can be patterned using the same mask in order to simplify manufacturing. The dimensions of PCM routing interconnects 120 and heating element routing interconnects 124 can be significantly larger than the dimensions of PCM contacts 118 and heating element contacts 122, in order to more easily establish external connections and to improve signal handling.

Although PCM RF switch 100A can simplify manufacturing, more easily establish external connection, and improve signal handling, notably, parasitic capacitors 140 having high capacitance values are formed. Parasitic capacitors 140, illustrated in FIG. 1A, are formed between PCM routing interconnects 120 and heating element routing interconnects 124 and/or between PCM contacts 118 and heating element contacts 122. As described below, parasitic capacitors 140 significantly degrade the frequency response of PCM RF switch 100A in both the ON and OFF states.

Figure 1B:
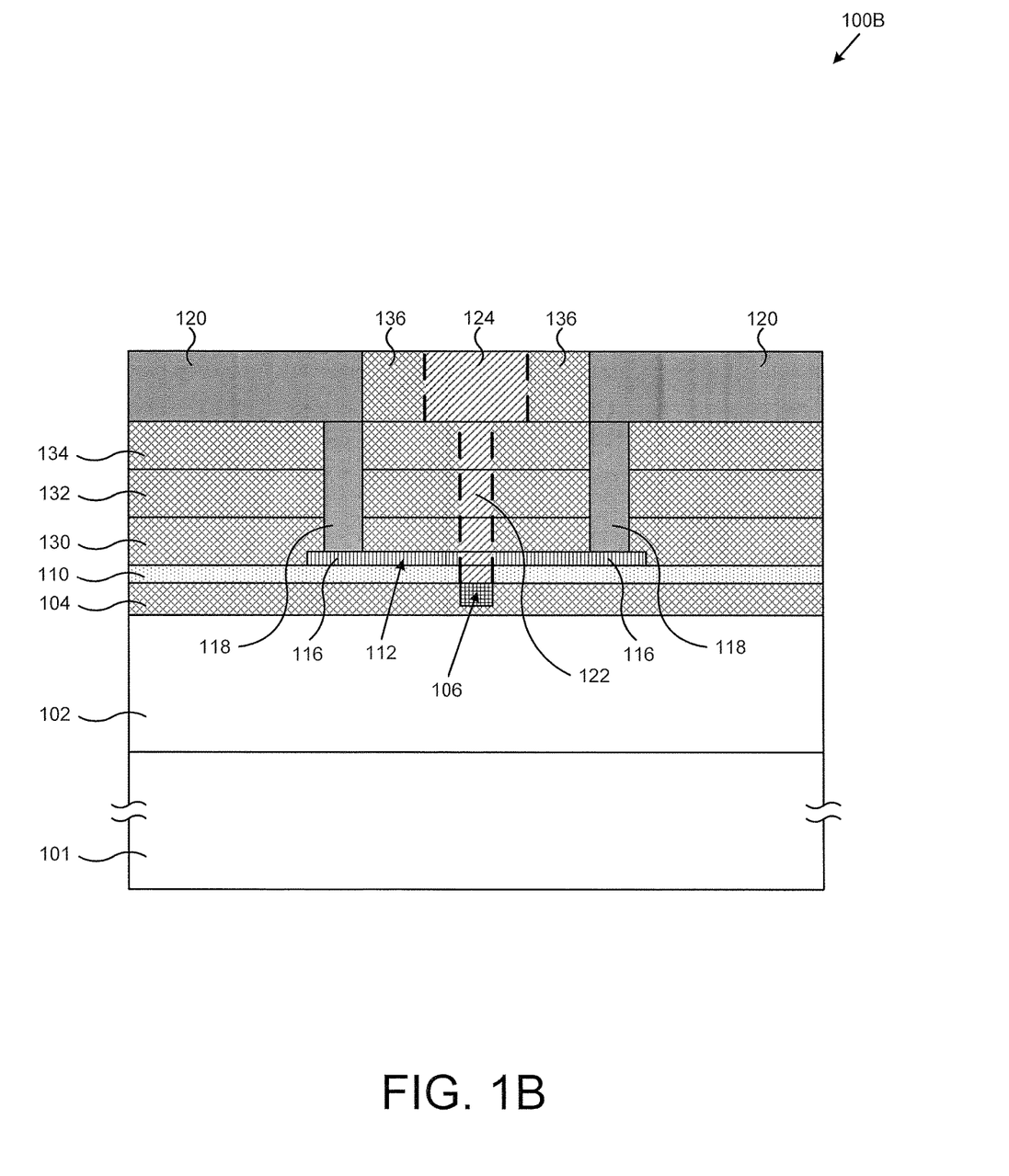
FIG. 1B illustrates a cross-sectional view of a portion of a PCM RF switch corresponding to the PCM RF switch of FIG. 1A according to one implementation of the present application.

FIG. 1B illustrates a cross-sectional view of a portion of a PCM RF switch corresponding to the PCM RF switch of FIG. 1A according to one implementation of the present application. FIG. 1B represents a cross-sectional view along line "B-B" in FIG. 1A. PCM RF switch 100B in FIG. 1B is similar to PCM RF switch 100A in FIG. 1A, except that PCM RF switch 100B in FIG. 1B includes substrate 101, interlayer dielectrics 130 and 134, and interlayer metal levels 132 and 136.

Substrate 101 in PCM RF switch 100B is situated below BEOL MLM 102. In one implementation, substrate 101 is an insulator, such as $SiO_2$. In various implementations, substrate 101 is a silicon (Si), silicon-on-insulator (SOI), sapphire, complementary metal-oxide-semiconductor (CMOS), bipolar CMOS (BiCMOS), or group III-V substrate.

Interlayer dielectric 130 in PCM RF switch 100B is situated on top of thermally conductive and electrically insulating material 110 and PCM 112. Interlayer metal level 132, interlayer dielectric 134, and interlayer metal level 136 are sequentially situated over interlayer dielectric 130. Interlayer metal levels 132 and 136 provide layers in which metal segments can be built. Interlayer dielectrics 130 and 134 provide insulation between interlayer metal levels 132 and 136. In the present implementation, interlayer metal level 136 is the top interlayer metal level. In various implementations, PCM RF switch 100B can include more interlayer metal levels and/or more interlayer dielectrics than shown in FIG. 1B.

In FIG. 1B, heating element contact 122 and heating element routing interconnect 124 are illustrated with dashed lines to indicate that they do not lie in the cross sectional plane along line "B-B" in FIG. 1A, and are instead seen through various structures of PCM RF switch 100B. PCM contacts 118 and heating element contact 122 extend from interlayer metal level 136 through interlayer dielectric 134, interlayer metal level 132, and interlayer dielectric 130. Since heating element 106 underlies PCM 112, heating element contact 122 additionally extends through thermally conductive and electrically insulating material 110. PCM routing interconnects 120 and heating element routing interconnect 124 are situated at the same interlayer metal level (i.e., PCM routing interconnects 120 and heating element routing interconnect 124 are situated at interlayer metal level 136).

Figure 1C:
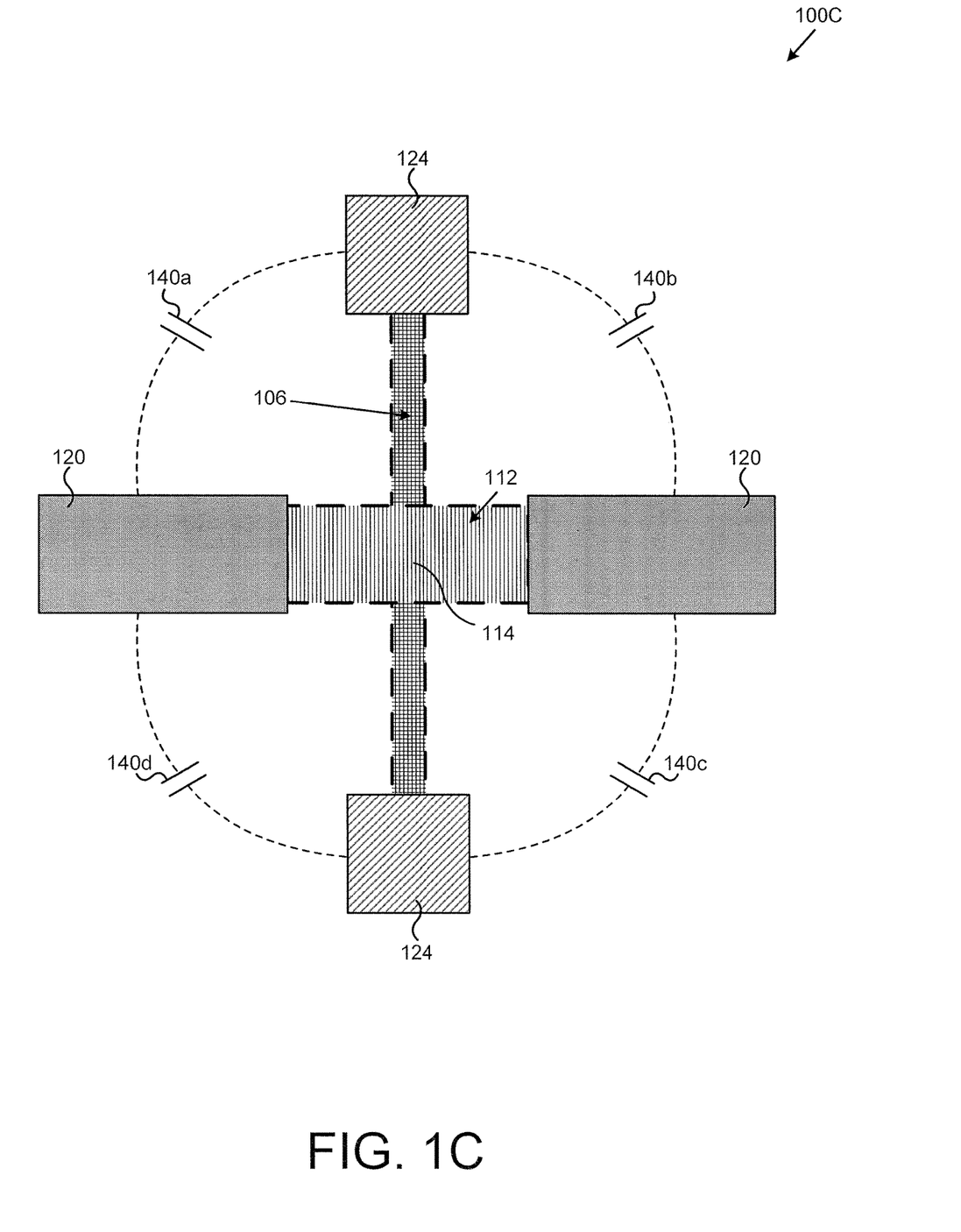
FIG. 1C illustrates a top view of a portion of a PCM RF switch corresponding to the PCM RF switch of FIG. 1A according to one implementation of the present application.

FIG. 1C illustrates a top view of a portion of the PCM RF switch of FIG. 1A, except that only selected structures are shown. As shown in FIG. 1C, heating element routing interconnects 124 are formed cross-wise to PCM routing interconnects 120. As used herein, "cross-wise" refers to the fact that, as seen from the top view of FIG. 1C, PCM routing interconnects 120 are not situated in the same row or in the same column as heating element routing interconnects 124. Likewise, PCM contacts 118 (shown in FIG. 1A) situated below PCM routing interconnects 120 are formed cross-wise to heating element contacts 122 (shown in FIG. 1A) situated below heating element routing interconnects 124.

PCM 112 and heating element 106 which underlies active segment 114 of PCM 112, are illustrated with dashed lines in FIG. 1C to illustrate that they do not lie at interlayer metal level 136 (shown in FIG. 1B), and are instead seen through various structures of the PCM RF switch. In contrast, PCM routing interconnects 120 and heating element routing interconnects 124 are both situated at interlayer metal level 136 (shown in FIG. 1B). Parasitic capacitors 140a, 140b, 140c, and 140d (collectively referred to as parasitic capacitors 140) are formed between PCM routing interconnects 120 and heating element routing interconnects 124 and/or between PCM contacts 118 (shown in FIG. 1A) and heating element contacts 122 (shown in FIG. 1A). As described below, parasitic capacitors 140 significantly degrade the frequency response of PCM RF switch 100C in both the ON and OFF states.

Figure 1D:
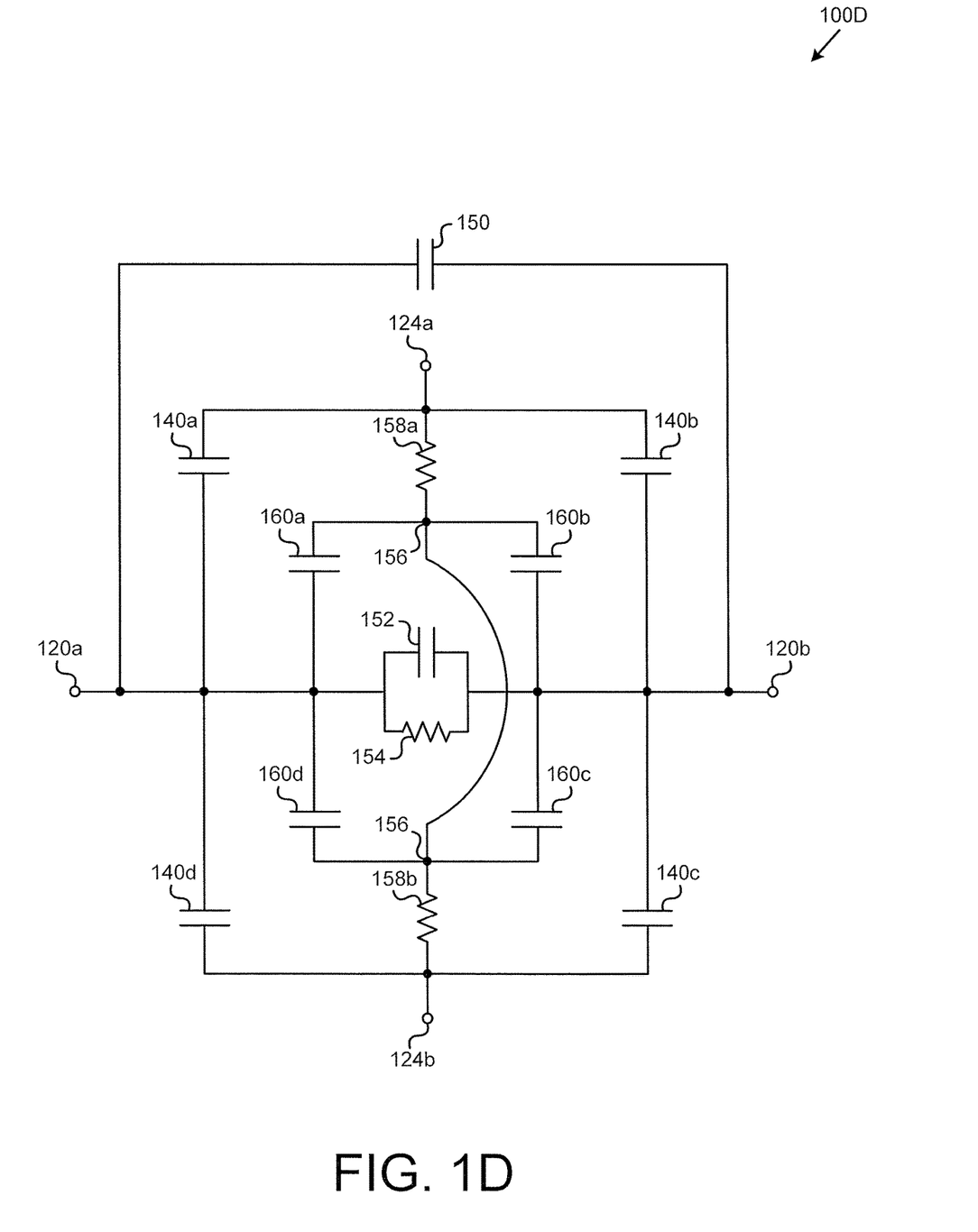
FIG. 1D illustrates a portion of a circuit model corresponding to the PCM RF switch of FIG. 1A according to one implementation of the present application.

FIG. 1D illustrates a portion of a circuit model corresponding to the PCM RF switch of FIG. 1A according to one implementation of the present application. As shown in FIG. 1D, circuit model 100D includes nodes 120a, 120b, 124a, 124b, and 156, and parasitic capacitors 140a, 140b, 140c, 140d, 150, 152, 160a, 160b, 160c, and 160d, and resistors 154, 158a, and 158b.

Nodes 120a and 120b (collectively referred to as nodes 120) correspond to respective PCM contacts and PCM routing interconnects (shown in FIG. 1A). Nodes 124a and 124b (collectively referred to as nodes 124) correspond to respective heating element contacts and heating element routing interconnects (shown in FIG. 1A). Node 156 corresponds to the approximate center of heating element 106 (shown in FIG. 1A).

Parasitic capacitors 140a, 140b, 140c, 140d (collectively referred to as parasitic capacitors 140) formed between nodes 120 and 124 represent coupling between PCM routing interconnects 120 and heating element routing interconnects 124 and/or between PCM contacts 118 and heating element contacts 122 (shown in FIG. 1A). Parasitic capacitor 150 formed between nodes 120a and 120b represents coupling between respective PCM contacts 118 and/or between respective PCM routing interconnects 120 (shown in FIG. 1A). Parasitic capacitor 152 formed between nodes 120a and 120b represents capacitance across active segment 114 of PCM 112 (shown in FIG. 1A) in the OFF state. In the ON state, parasitic capacitor 152 is not formed. Resistor 154 formed between nodes 120a and 120b represents resistance across PCM 112 (shown in FIG. 1A). In the OFF state, resistor 154 represents $R_{OFF}$ and can range from approximately ten kilo-Ohms to approximately one mega-Ohm (10 kΩ-1MΩ). In the ON state, resistor 154 represents $R_{ON}$ and can be approximately one Ohm (1Ω). Resistors 158a and 158b (collectively referred to as resistors 158) formed between nodes 124 and 156 represent resistance created by the length of heating element 106 between heating element contacts 122 (shown in FIG. 1A) and the center of heating element 106. Parasitic capacitors 160a, 160b, 160c, and 160d (collectively referred to as parasitic capacitors 160) formed between nodes 156 and 120 represent parasitic capacitive coupling between heating element 106 and PCM contacts 118 (shown in FIG. 1A). In FIG. 1D, parasitic capacitors 140, 150, 152, and 160 all contribute to degrading the frequency response of the PCM RF switch.

The resistance value of resistor 154 generally exhibits a tradeoff with capacitance values of parasitic capacitors 140 and 150. The expanse of PCM 112, and the corresponding separation between respective PCM contacts 118 and/or between respective PCM routing interconnects 120 (shown in FIG. 1A), can be kept small in order to reduce the resistance value of resistor 154. However, this technique results in an increase in the capacitance values of parasitic capacitors 140 and 150 due to the corresponding reduced separation between respective PCM contacts 118 and/or between respective PCM routing interconnects 120 (shown in FIG. 1A). Conversely, the resistance value of resistor 154 generally increases, and the capacitance values of parasitic capacitors 140 and 150 generally decrease, due to large expanse of PCM 112 and due to corresponding increased separation between respective PCM contacts 118 and/or between respective PCM routing interconnects 120. The increased resistance value of resistor 154 can have significant consequences on the performance of PCM RF switch 100A in the ON state where low $R_{ON}$ is required. Accordingly, increasing the separation between respective PCM contacts 118 and/or between respective PCM routing interconnects 120 can be unsuitable for reducing parasitic capacitance of PCM RF switch 100A.

The separation between passive segments 116 of PCM 112 (shown in FIG. 1A) can be kept large (by increasing the expanse of active segment 114 that separates passive segments 116) in order to reduce the capacitance value of parasitic capacitor 152. However, because the capacitance value of parasitic capacitor 152 is significantly smaller compared to the capacitance values of parasitic capacitors 140, the reduction in the capacitance value of parasitic capacitor 152 may be insignificant. For example, in one implementation, the capacitance values of parasitic capacitors 140 are approximately two and a half femto-Farads (2.5 fF), while the capacitance value of parasitic capacitor 152 is approximately a quarter femto-Farad (0.25 fF). Additionally, parasitic capacitor 152 is only formed in the OFF state, thus, reducing its capacitance value does not improve the frequency response of PCM RF switch 100A in FIG. 1A in the ON state. Accordingly, increasing the separation between passive segments 116 of PCM 112 (by increasing the expanse of active segment 114 that separates passive segments 116) can be unsuitable for reducing parasitic capacitance of PCM RF switch 100A. As described below, in the present application, reduced parasitic capacitance is achieved by reducing capacitance values of parasitic capacitors 140.

Figure 2A:
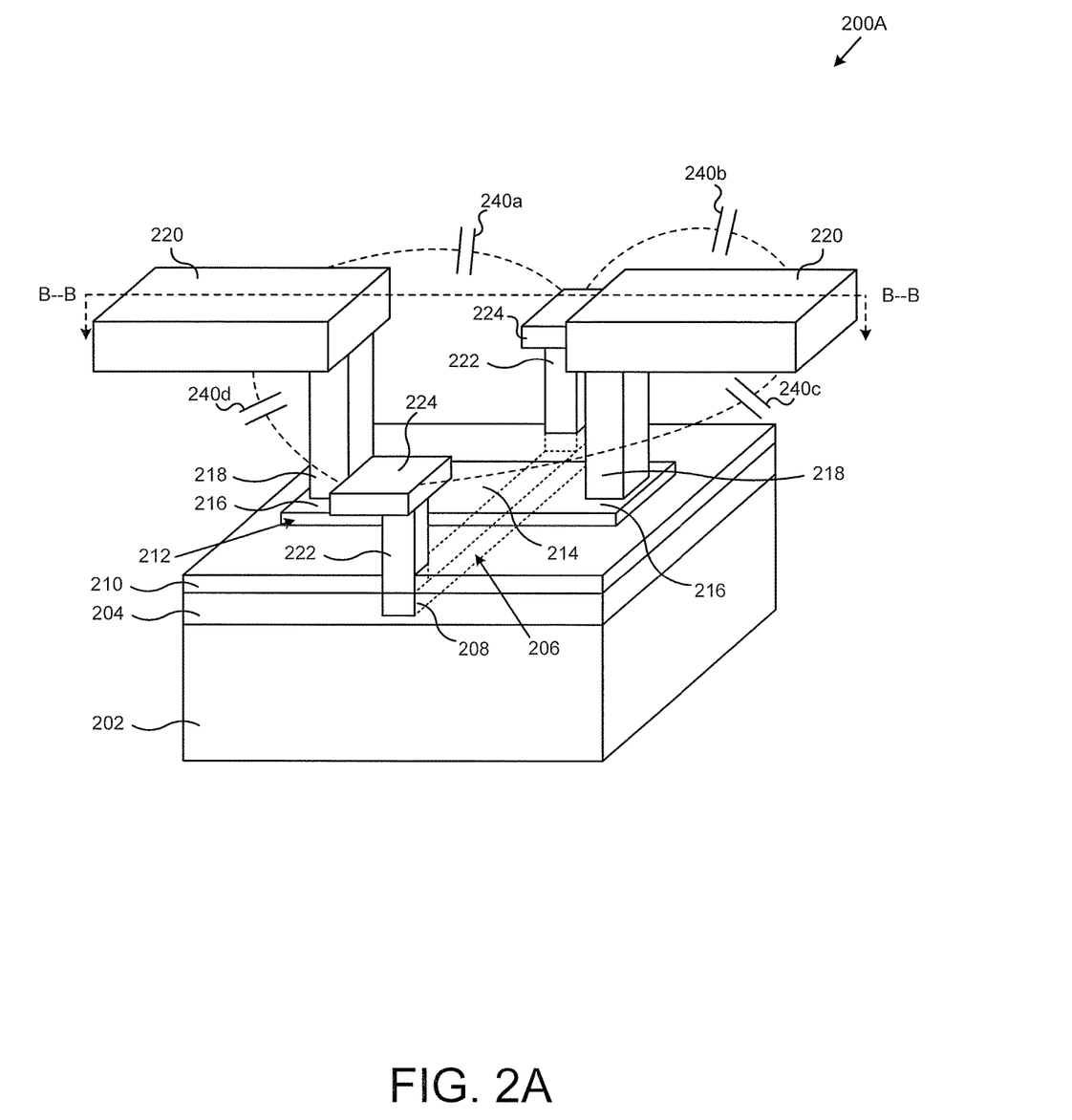
FIG. 2A illustrates a perspective view of a portion of a PCM RF switch according to one implementation of the present application.

FIG. 2A illustrates a perspective view of a portion of a PCM RF switch according to one implementation of the present application. As shown in FIG. 2A, PCM RF switch 200A includes BEOL MLM 202, lower dielectric 204, heating element 206 having terminal portions 208, thermally conductive and electrically insulating material 210, PCM 212 having active segment 214 and passive segments 216, PCM contacts 218, PCM routing interconnects 220, heating element contacts 222, heating element routing interconnects 224, and parasitic capacitors 240a, 240b, 240c, and 240d, collectively referred to as parasitic capacitors 240. For purposes of illustration, the perspective view in FIG. 2A shows selected structures of PCM RF switch 200A. PCM RF switch 200A may include other structures not shown in FIG. 2A.

PCM RF switch 200A in FIG. 2A is similar to PCM RF switch 100A in FIG. 1A, except that, in PCM RF switch 200A in FIG. 2A, heating element routing interconnects 224 are situated at a different interlayer metal level relative to PCM routing interconnects 220. In FIG. 2A, as in FIG. 1A, heating element routing interconnects 224 are still situated above heating element 206. However, the "height" of heating element contacts 222 in FIG. 2A are less than the "height" of heating element contacts 122 in FIG. 1A. As a result, PCM routing interconnects 220 are situated above heating element routing interconnects 224. In another implementation, PCM routing interconnects 220 can instead be situated below heating element routing interconnects 224. As is typical when multi-level metallization is employed, the thickness of heating element routing interconnects 224, which are situated at a lower interlayer metal level, is less than the thickness of PCM routing interconnects 220.

Figure 2B:
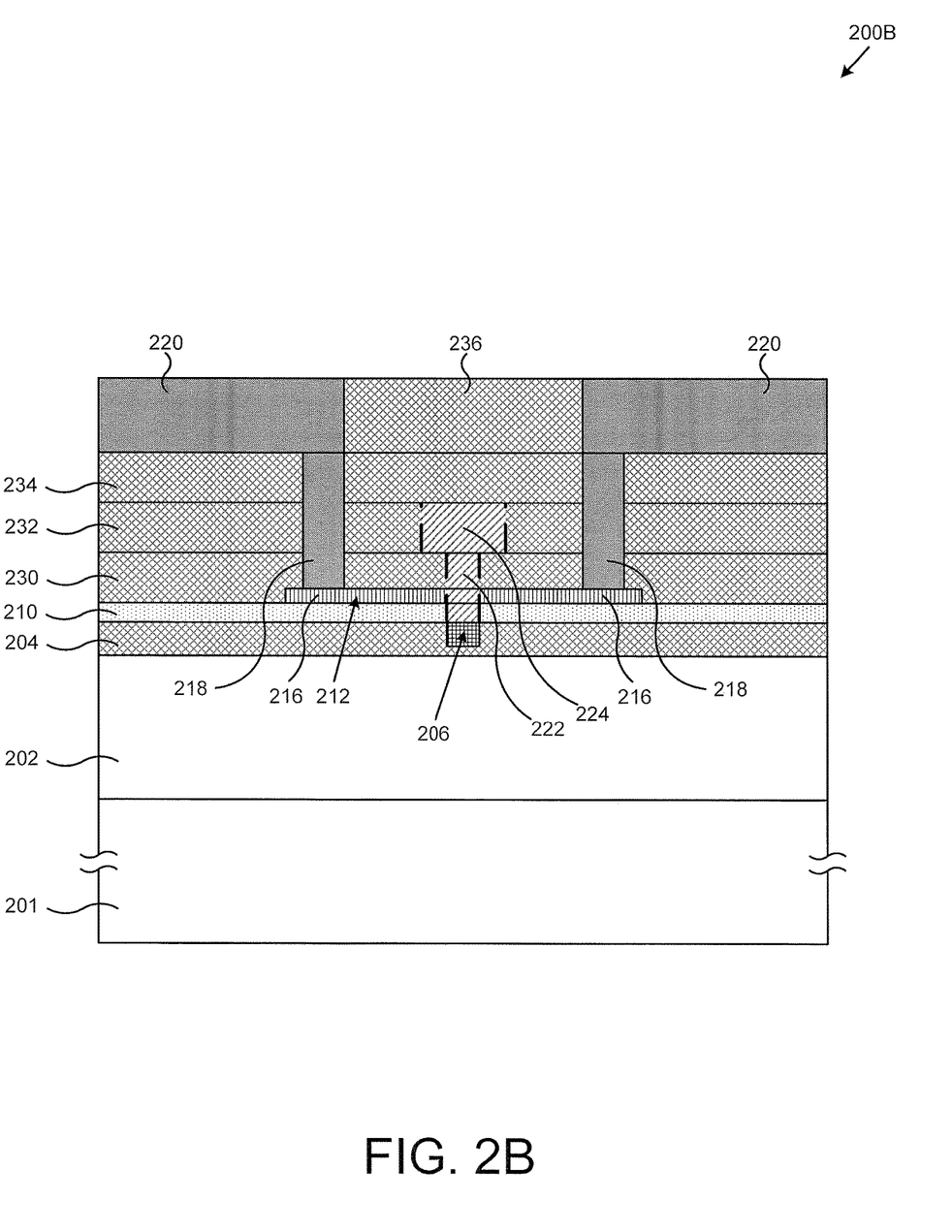
FIG. 2B illustrates a cross-sectional view of a portion of a PCM RF switch corresponding to the PCM RF switch of FIG. 2A according to one implementation of the present application.

FIG. 2B illustrates a cross-sectional view of a portion of a PCM RF switch corresponding to the PCM RF switch of FIG. 2A according to one implementation of the present application. FIG. 2B represents a cross-sectional view along line "B-B" in FIG. 2A. PCM RF switch 200B in FIG. 2B is similar to PCM RF switch 100B in FIG. 1B, except that, in PCM RF switch 200B in FIG. 2B, heating element routing interconnect 224 is situated at a different interlayer metal level relative to PCM routing interconnects 220, and heating element contact 222 is situated below interlayer dielectric 234 and interlayer metal level 232. PCM routing interconnects 220 are situated at interlayer metal level 236 and connect to passive segments 216 of PCM 212 through PCM contacts 218. As shown in FIG. 2B, PCM contacts 218 comprise interconnect or via metal segments in interlayer dielectric 230, interlayer metal level 232, and interlayer dielectric 234. Heating element routing interconnect 224 is situated above interlayer dielectrics 230, i.e. at interlayer metal level 232, and connects to heating element 206 through heating element contact 222. In various implementations, a greater number of interlayer metal levels can separate heating element routing interconnect 224 from PCM routing interconnects 220, or separate heating element routing interconnect 224 from PCM 212. Substrate 201 in PCM RF switch 200B is situated below BEOL MLM 202. In one implementation, substrate 201 is an insulator, such as $SiO_2$. In various implementations, substrate 201 is a silicon (Si), silicon-on-insulator (SOI), sapphire, complementary metal-oxide-semiconductor (CMOS), bipolar CMOS (BiC-MOS), or group substrate.

Figure 2C:
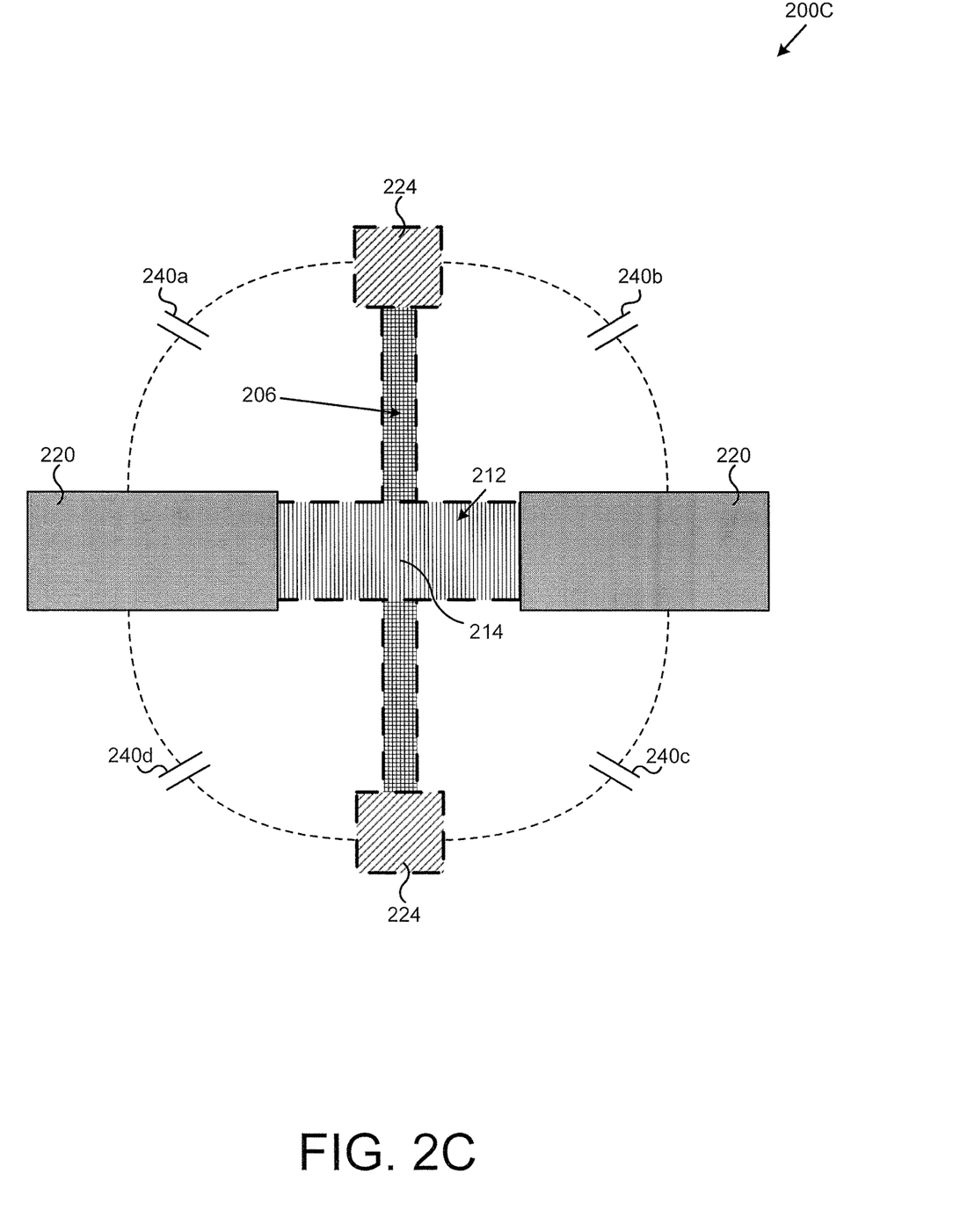
FIG. 2C illustrates a top view of a portion of a PCM RF switch corresponding to the PCM RF switch of FIG. 2A according to one implementation of the present application.

FIG. 2C illustrates a top view of a portion of a PCM RF switch corresponding to the PCM RF switch of FIG. 2A according to one implementation of the present application. PCM RF switch 200C in FIG. 2C is similar to PCM RF switch 100C in FIG. 1C, except that, in PCM RF switch 200C in FIG. 2C, the dimensions of heating element routing interconnects 224 appear smaller than the dimensions of PCM routing interconnects 220, and heating element routing interconnects 224 are illustrated with dashed lines in FIG. 2C to illustrate that they do not lie at interlayer metal level 236 in FIG. 2B; and are instead seen through various structures of PCM RF switch 200C. As shown in FIG. 2C, heating element routing interconnects 224 are formed crosswise to PCM routing interconnects 220. Likewise, PCM contacts 218 (shown in FIG. 2A) that are below PCM routing interconnects 220 are formed cross-wise to heating element contacts 222 (shown in FIG. 2A) that are below heating element routing interconnects 224. As discussed below, parasitic capacitors 240a, 240b, 240c, and 240d (collectively referred to as parasitic capacitors 240) have reduced capacitance values, and reduce the total insertion loss and the total OFF state parasitic capacitance ($C_{OFF}$) of PCM RF switch 200C.

Figure 3A:
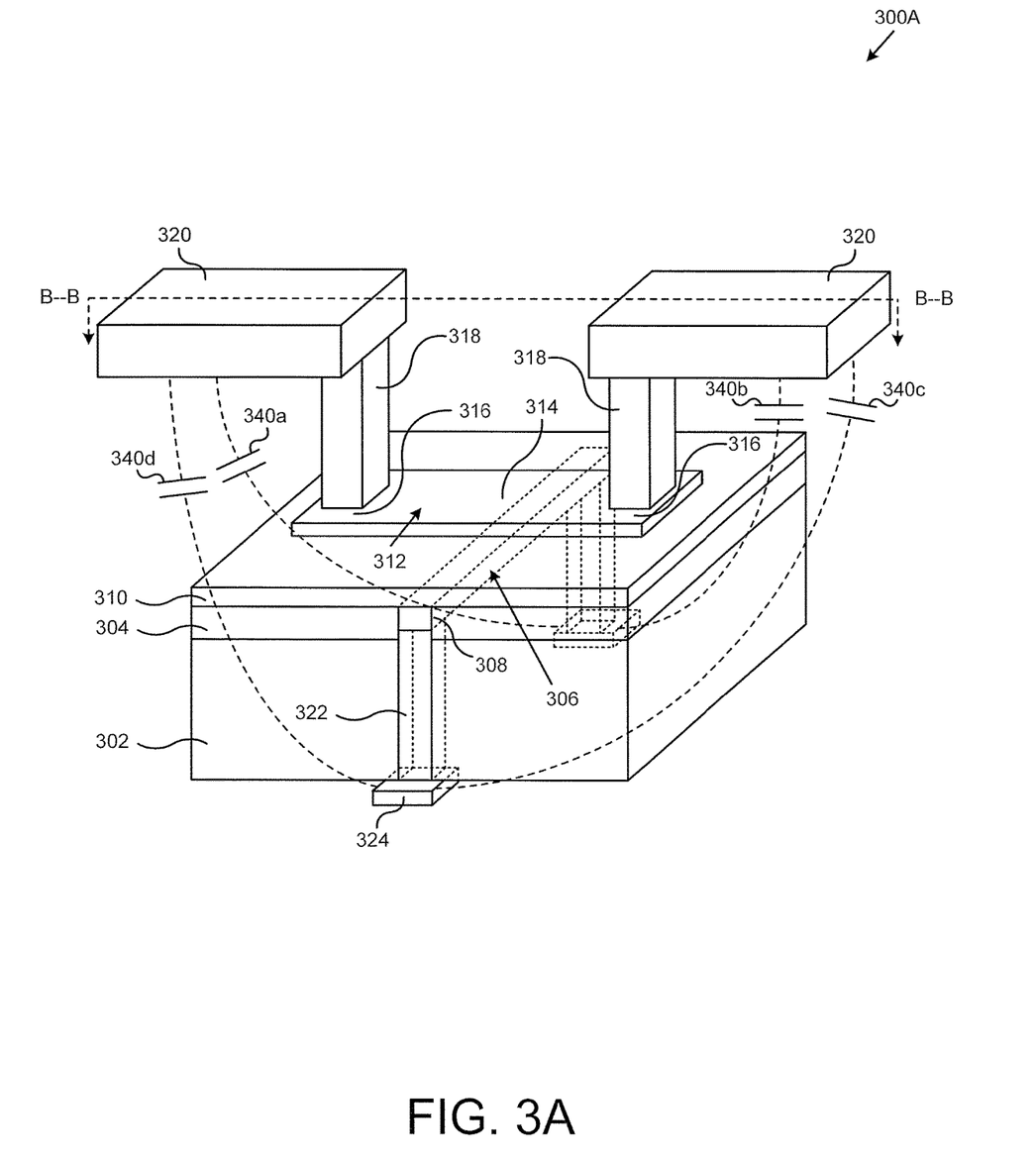
FIG. 3A illustrates a perspective view of a portion of a PCM RF switch according to one implementation of the present application.

FIG. 3A illustrates a perspective view of a portion of a PCM RF switch according to one implementation of the present application. As shown in FIG. 3A, PCM RF switch 300A includes BEOL MLM 302, lower dielectric 304, heating element 306 having terminal portions 308, thermally conductive and electrically insulating material 310, PCM 312 having active segment 314 and passive segments 316, PCM contacts 318, PCM routing interconnects 320, heating element contacts 322, heating element routing interconnects 324, and parasitic capacitors 340a, 340b, 340c, and 340d, collectively referred to as parasitic capacitors 340. For purposes of illustration, the perspective view in FIG. 3A shows selected structures of PCM RF switch 300A. PCM RF switch 300A may include other structures not shown in FIG. 3A.

PCM RF switch 300A in FIG. 3A is similar to PCM RF switch 100A in FIG. 1A, except that in PCM RF switch 300A in FIG. 3A heating element routing interconnects 324 are situated below heating element 306, and also heating element routing interconnects 324 are situated at a different interlayer metal level relative to PCM routing interconnects 320. Heating element contacts 322 in FIG. 3A are built within BEOL MLM 302. As shown in FIG. 3A, PCM routing interconnects 320 are situated above BEOL MLM 302 and above heating element routing interconnects 324. In various implementations, the relative arrangement and relative positions of heating element contacts 322 (along with heating element routing interconnects 324) and PCM contacts 318 (along with PCM routing interconnects 320) can be reversed. Thus, PCM contacts 318 can be built within BEOL MLM 302 instead of heating element contacts 322, and PCM routing interconnects 320 can be thus situated below heating element routing interconnects 324 (since heating element routing interconnects 324 would be situated above BEOL MLM 302 in that implementation). In the example of FIG. 3A, and as is typical when multi-level metallization is employed, the thickness of heating element routing interconnects 324, which are situated at a lower interlayer metal level, is less than the thickness of PCM routing interconnects 320.

Figure 3B:
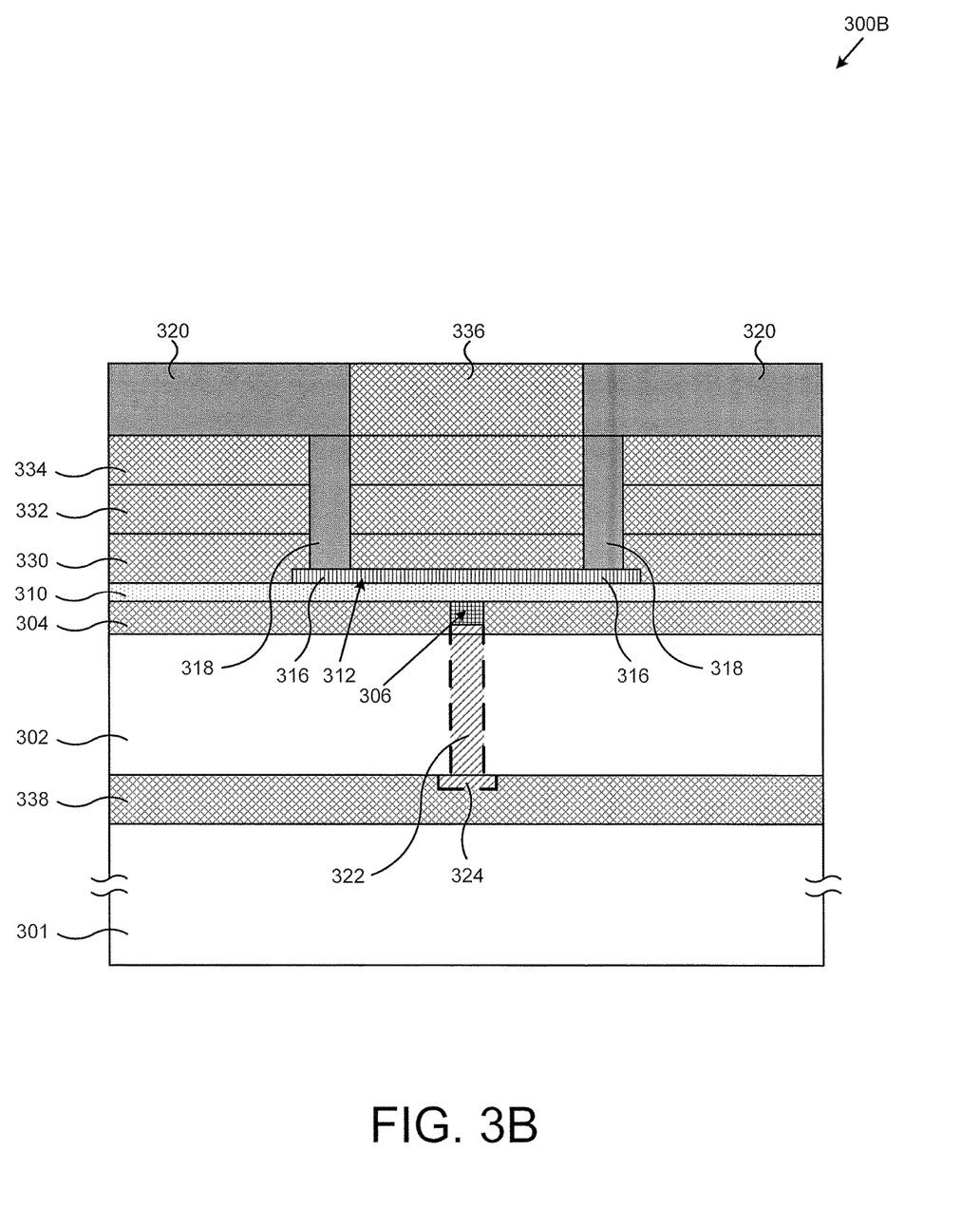
FIG. 3B illustrates a cross-sectional view of a portion of a PCM RF switch corresponding to the PCM RF switch of FIG. 3A according to one implementation of the present application.

FIG. 3B illustrates a cross-sectional view of a portion of a PCM RF switch corresponding to the PCM RF switch of FIG. 3A according to one implementation of the present application. FIG. 3B represents a cross-sectional view along line "B-B" in FIG. 3A. PCM RF switch 300B in FIG. 3B is similar to PCM RF switch 100B in FIG. 1B, except that, in PCM RF switch 300B in FIG. 3B, heating element contact 322 is built within BEOL MLM 302, and heating element routing interconnect 324 is situated at a different (i.e. a lower) interlayer metal level relative to PCM routing interconnects 320. PCM routing interconnects 320 are situated at interlayer metal level 336 and are connected to passive segments 316 of PCM 312 through PCM contacts 318. As shown in FIG. 3B, PCM contacts 318 comprise interconnect or via metal segments in interlayer dielectric 330, interlayer metal level 332, and interlayer dielectric 334.

As further shown in FIG. 3B, heating element routing interconnect 324 is situated at interlayer metal level 338. In the present implementation, interlayer metal level 338 is a lowest interlayer metal level of PCM RF switch 300B. In various implementations, additional interlayer metal levels can exist below heating element routing interconnect 324 and below interlayer metal level 338 (in which case interlayer metal level 338 would not be the lowest interlayer metal level). In one implementation, a heat spreader (not shown in FIG. 3B) is integrated with BEOL MLM 302 underlying heating element 306 and is configured to avoid electrically connecting to heating element contact 322 and heating element routing interconnect 324. Substrate 301 in PCM RF switch 300B is situated below BEOL MLM 302. In one implementation, substrate 301 is an insulator, such as $SiO_2$. In various implementations, substrate 301 is a silicon (Si), silicon-on-insulator (SOI), sapphire, complementary metal-oxide-semiconductor (CMOS), bipolar CMOS (BiCMOS), or group III-V substrate.

Figure 3C:
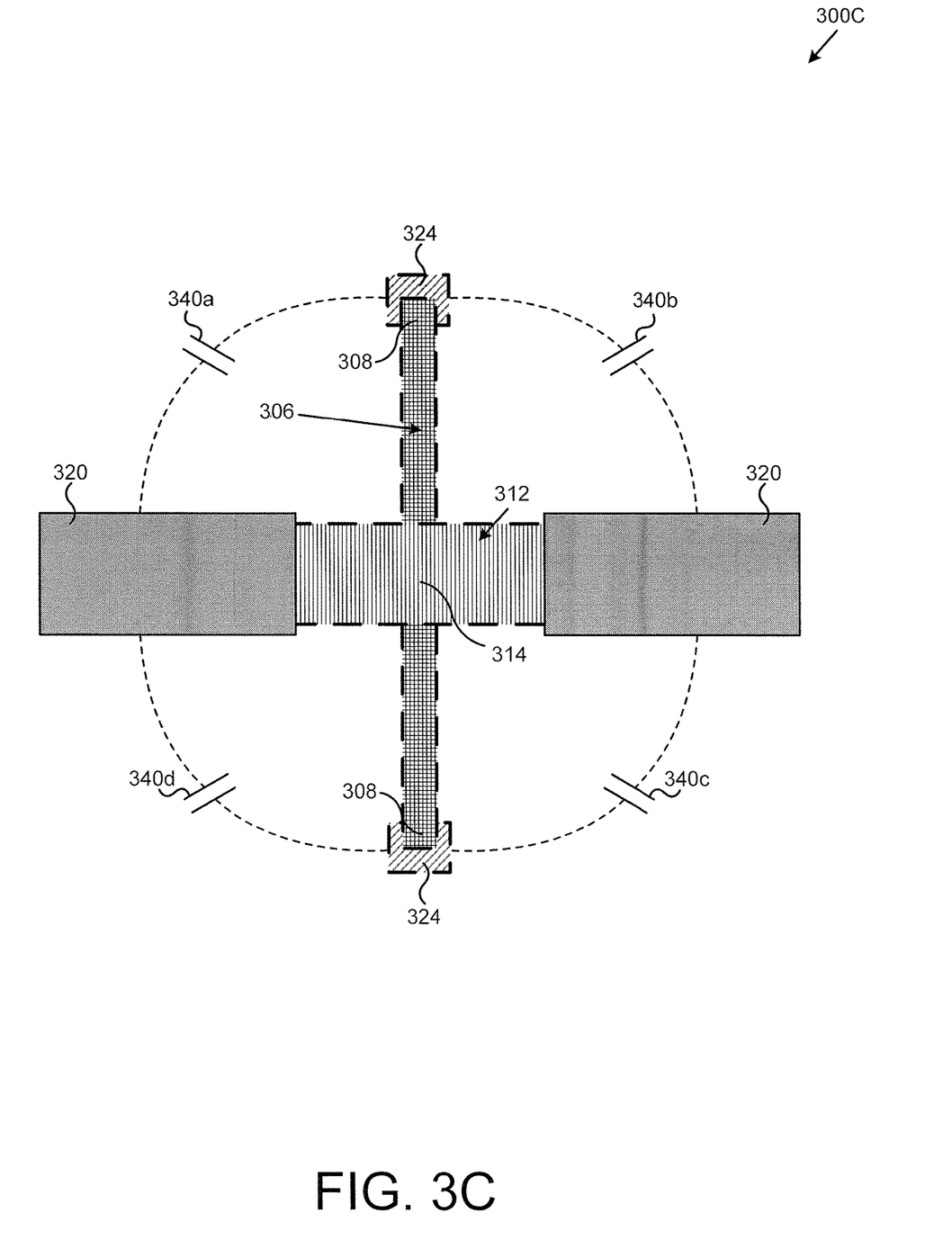
FIG. 3C illustrates a top view of a portion of a PCM RF switch corresponding to the PCM RF switch of FIG. 3A according to one implementation of the present application.

FIG. 3C illustrates a top view of a portion of a PCM RF switch corresponding to the PCM RF switch of FIG. 3A according to one implementation of the present application. PCM RF switch 300C in FIG. 3C is similar to PCM RF switch 100C in FIG. 1C, except that, in PCM RF switch 300C in FIG. 3C, the dimensions of heating element routing interconnects 324 appear smaller than the dimensions of PCM routing interconnects 320, and heating element routing interconnects 324 are illustrated with dashed lines in FIG. 3C to illustrate that they do not lie at interlayer metal level 336 in FIG. 3B, and are instead seen through various structures of PCM RF switch 300C. In FIG. 3C, terminal portions 308 of heating element 306 are shown to illustrate that heating element routing interconnects 324 are situated below heating element 306. As shown in FIG. 3C, heating element routing interconnects 324 are formed cross-wise to PCM routing interconnects 320. Likewise, PCM contacts 318 (shown in FIG. 3A) that are below PCM routing interconnects 320 are formed cross-wise to heating element contacts 322 (shown in FIG. 3A) that are below heating element 306. As discussed below, parasitic capacitors 340a, 340b, 340c, and 340d (collectively referred to as parasitic capacitors 340) have reduced capacitance values, and reduce the total insertion loss and the total $C_{OFF}$ of PCM RF switch 300C.

Figure 4:
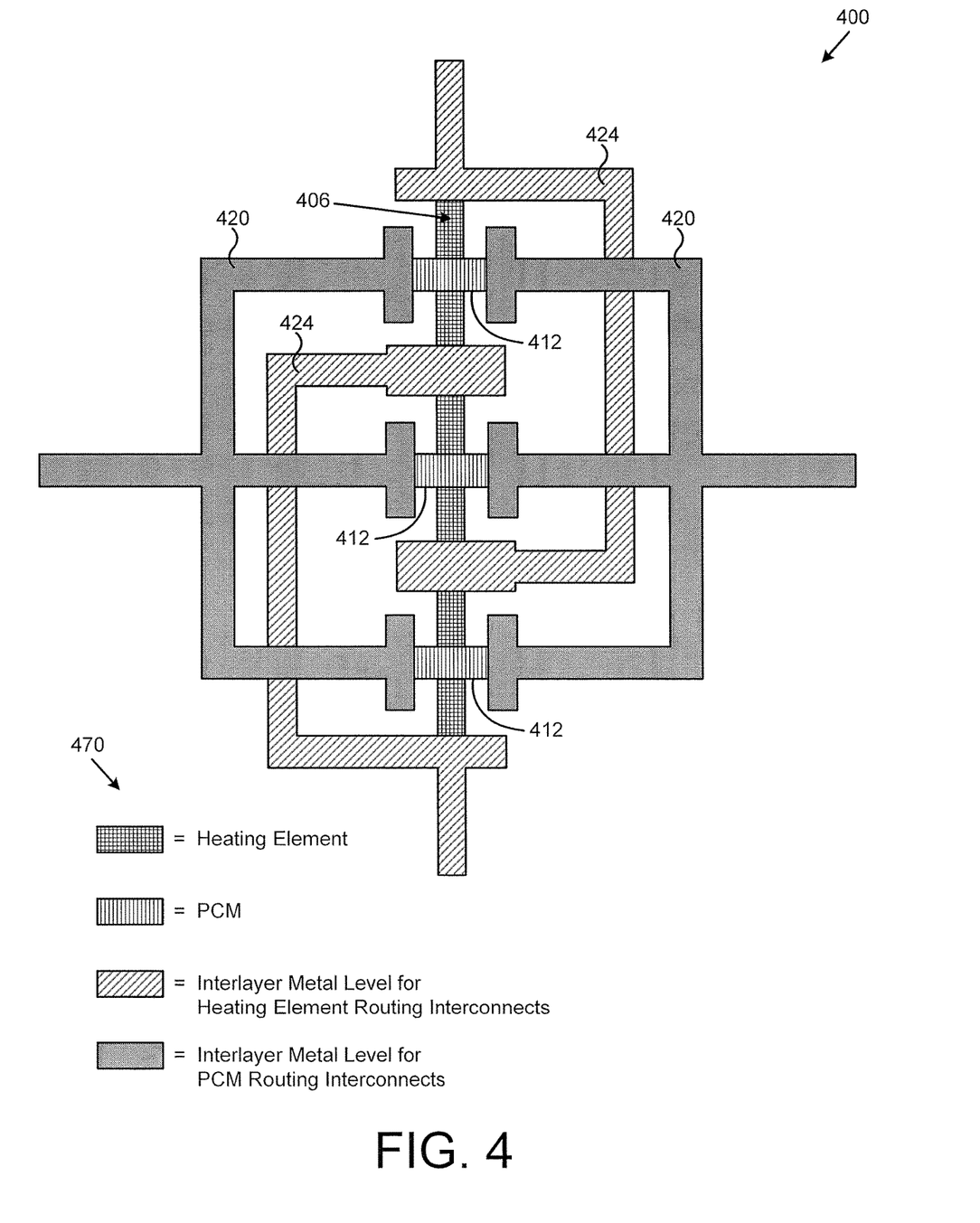
FIG. 4 illustrates a top view of a portion of an array of PCM RF switches according to one implementation of the present application.

FIG. 4 illustrates a top view of a portion of an array of PCM RF switches according to one implementation of the present application. As shown in FIG. 4, PCM RF switch 400 includes a plurality of PCM RF switches arranged in an array. Each PCM 412 represents one of the plurality of RF switches in the array, while a single heating element 406 underlies all PCMs 412. Pluralities of PCM routing interconnects are connected in arrays of fingers to form two composite PCM routing interconnects 420. Similarly, pluralities of heating element routing interconnects are connected in arrays of fingers to form two composite heating element routing interconnects 424. Each composite heating element routing interconnect 424 is situated at a different interlayer metal level relative to each composite PCM routing interconnect 420, as indicated by legend 470 in FIG. 4. As a result, PCM RF switch 400 can be easily arrayed in a fashion that maintains low resistance, without requiring fingers of composite PCM routing interconnects 420 or fingers of composite heating element routing interconnects 424 to be specially laid out to avoid intersecting.

The consequences of parasitic capacitance are typically compounded for an array design. Whereas heating element routing interconnects in a single-switch implementation, such as FIG. 2C, parasitically couple to only two PCM routing interconnects, in FIG. 4, heating element routing interconnects in each RF switch parasitically couples to four PCM routing interconnects (two on each side). Additionally, fingers of composite PCM routing interconnects 420 and fingers of composite heating element routing interconnect 424 increase the area that is available to parasitically couple. Because composite heating element routing interconnects 424 are situated at a different interlayer metal level relative to composite PCM routing interconnects 420, PCM RF switch 400 compounds the reduced parasitic capacitance values discussed above in relation to FIGS. 2A, 2B, 2C, 3A, 3B, and 3C. Thus, PCM RF switch 400 can realize an array design where compounded parasitic capacitance would otherwise render a switch inoperable or infeasible. In one implementation, one of composite PCM routing interconnects 420 can also be situated at a different interlayer metal level relative to another one of composite PCM routing interconnects 420.

PCM RF switches, such as PCM RF switch 200A, disclosed in the present application exhibit improved overall performance. For example, because heating element routing interconnects 224 are situated at a different interlayer metal level relative to PCM routing interconnects 220, heating element routing interconnects 224 and PCM routing interconnects 220 have increased separation, which significantly reduces the capacitance values of parasitic capacitors 240. Because heating element contacts 222 have a reduced "height," they have less area for parasitic capacitive coupling with PCM contacts 218, and thus further reduce the capacitance values of parasitic capacitors 240. Also, smaller relative thicknesses of heating element routing interconnects 224 can further reduce the area available to couple with PCM routing interconnects 220, and further reduce the capacitance values of parasitic capacitors 240. In the ON state, reduced parasitic capacitance values reduce the total insertion loss of PCM RF switch 200A due to less energy coupling between PCM routing interconnects 220 and heating element routing interconnects 224 and/or between PCM contacts 218 and heating element contacts 222. In the OFF state, reduced parasitic capacitance values reduce the total $C_{OFF}$ of PCM RF switch 200A due to increased isolation between PCM routing interconnects 220 and heating element routing interconnects 224 and/or between PCM contacts 218 and heating element contacts 222. In one implementation, the capacitance values of parasitic capacitors 140 of PCM RF switch 100A in FIG. 1A are approximately two and a half femto-Farads (2.5 fF), while the capacitance values of parasitic capacitors 240 of PCM RF switch 200A in FIG. 2A are between a half of a femto-Farad and one femto-Farad (0.5 fF-1.0 fF).

PCM RF switches, such as PCM RF switch 300A, disclosed in the present application exhibit further improved performance. In switching devices that utilize planar semiconductor layers, such as silicon (Si) or gallium arsenide (GaAs) layers, contacts and interconnects generally cannot be situated both above and below the planar semiconductor layer without creating a short, increasing manufacturing complexity, or increasing device dimensions. Because PCM RF switch 300A utilizes BEOL MLM 302, heating element contacts 322 and heating element routing interconnects 324 can be situated below heating element 306, while PCM contacts 318 and PCM routing interconnects 320 are situated above heating element 306. Because heating element contacts 322 and heating element routing interconnects 324 are situated below heating element 306, while PCM contacts 318 and PCM routing interconnects 320 are situated above heating element 306, PCM RF switch 300A further reduces the capacitance values of parasitic capacitors 340. When heating element routing interconnects 324 are situated at the lowest interlayer metal level 338 and PCM routing interconnects 320 are situated at the top interlayer metal level 336, parasitic capacitors 340 are significantly decoupled. In one implementation, the capacitance values of parasitic capacitors 340 of PCM RF switch 300A in FIG. 3A are negligible or approximately 100 atto-Farads (100 aF):

In addition to reduced parasitic capacitance, PCM RF switches disclosed in the present application allow more freedom to choose different dielectric materials with a wider range of dielectric constants for interlayer dielectrics due to the increased separations between routing interconnects. Moreover, because the PCM and the heating element routing interconnects are situated at interlayer metal levels, PCM RF switches disclosed in the present application are compatible with common multi-level fabrication processes and do not require specialty manufacturing or processes to achieve a reduce parasitic capacitance RF switch.

Thus, various implementations of the present application achieve a reduce parasitic capacitance RF switch that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A reduced parasitic capacitance radio frequency (RF) switch comprising:
   a phase-change material (PCM) and a heating element underlying an active segment of said PCM and extending outward and transverse to said PCM;
   a PCM contact connecting a PCM routing interconnect with a passive segment of said PCM, said passive segment extending outward and transverse to said heating element;
   a heating element contact connecting a heating element routing interconnect with a terminal segment of said heating element;
   said heating element contact being situated cross-wise to said PCM contact, and wherein said heating element routing interconnect is situated at a different interlayer metal level relative to said PCM routing interconnect so as to achieve said reduced parasitic capacitance for said RF switch.

2. The reduced parasitic capacitance RF switch of claim 1, wherein said reduced parasitic capacitance is achieved by reducing a capacitance value of a parasitic capacitor formed between said PCM contact and said heating element contact.

3. The reduced parasitic capacitance RF switch of claim 1, wherein said reduced parasitic capacitance is achieved by reducing a capacitance value of a parasitic capacitor formed between said PCM routing interconnect and said heating element routing interconnect.

4. The reduced parasitic capacitance RF switch of claim 1, wherein said heating element routing interconnect is situated at a lowest interlayer metal level.

5. The reduced parasitic capacitance RF switch of claim 1, wherein said PCM routing interconnect is situated at a top interlayer metal level.

6. The reduced parasitic capacitance RF switch of claim 1, wherein said PCM is selected from the group consisting of germanium telluride ($Ge_XTe_Y$), germanium antimony telluride ($Ge_XSb_YTe_Z$), and any other chalcogenide.

7. The reduced parasitic capacitance RF switch of claim 1, wherein said heating element comprises a material selected from the group consisting of tungsten (W), molybdenum (Mo), titanium (Ti), titanium nitride (TiN), titanium tungsten (TiW), tantalum (Ta), nickel chromium (NiCr), and nickel chromium silicon (NiCrSi).

8. The reduced parasitic capacitance RF switch of claim 1, wherein a plurality of said RF switches are arranged in an array of RF switches, and wherein a corresponding plurality of said heating element routing interconnects are situated at said different interlayer metal level relative to a corresponding plurality of said PCM routing interconnects so as to achieve a further reduced parasitic capacitance for said array of RF switches.

9. A reduced parasitic capacitance radio frequency (RF) switch comprising:
   a phase-change material (PCM) and a heating element underlying an active segment of said PCM and extending outward and transverse to said PCM;
   a PCM contact connecting a PCM routing interconnect with a passive segment of said PCM, said passive segment extending outward and transverse to said heating element;
   a heating element contact connecting a heating element routing interconnect with a terminal segment of said heating element;
   said heating element contact being situated cross-wise to said PCM contact;
   said heating element routing interconnect is situated above said heating element;
   said PCM routing interconnect is situated above said heating element routing interconnect so as to achieve said reduced parasitic capacitance for said RF switch.

10. The reduced parasitic capacitance RF switch of claim 9, wherein said reduced parasitic capacitance is achieved by reducing a capacitance value of a parasitic capacitor formed between said PCM contact and said heating element contact.

11. The reduced parasitic capacitance RF switch of claim 9, wherein said reduced parasitic capacitance is achieved by reducing a capacitance value of a parasitic capacitor formed between said PCM routing interconnect and said heating element routing interconnect.

12. The reduced parasitic capacitance RF switch of claim 9, wherein said PCM is selected from the group consisting of germanium telluride ($Ge_XTe_Y$), germanium antimony telluride ($Ge_XSb_YTe_Z$), and any other chalcogenide.

13. The reduced parasitic capacitance RF switch of claim 9, wherein said heating element comprises a material selected from the group consisting of tungsten (W), molybdenum (Mo), titanium (Ti), titanium nitride (TiN), titanium tungsten (TiW), tantalum (Ta), nickel chromium (NiCr), and nickel chromium silicon (NiCrSi).

14. The reduced parasitic capacitance RF switch of claim 9, wherein a plurality of said RF switches are arranged in an array of RF switches, and wherein a corresponding plurality of said heating element routing interconnects are situated above said heating element, and a corresponding plurality of said PCM routing interconnects are situated above said corresponding plurality of said heating element routing interconnects so as to achieve a further reduced parasitic capacitance for said array of RF switches.

15. A reduced parasitic capacitance radio frequency (RF) switch comprising:
   a phase-change material (PCM) and a heating element underlying an active segment of said PCM and extending outward and transverse to said PCM;
   a PCM contact connecting a PCM routing interconnect with a passive segment of said PCM, said passive segment extending outward and transverse to said heating element;
   a heating element contact connecting a heating element routing interconnect with a terminal segment of said heating element;
   said heating element contact being situated cross-wise to said PCM contact;
   said heating element routing interconnect is situated below said heating element;
   said PCM routing interconnect is situated above said heating element so as to achieve said reduced parasitic capacitance for said RF switch.

16. The reduced parasitic capacitance RF switch of claim 15, wherein said reduced parasitic capacitance is achieved by reducing a capacitance value of a parasitic capacitor formed between said PCM contact and said heating element contact.

17. The reduced parasitic capacitance RF switch of claim 15, wherein said reduced parasitic capacitance is achieved by reducing a capacitance value of a parasitic capacitor formed between said PCM routing interconnect and said heating element routing interconnect.

18. The reduced parasitic capacitance RF switch of claim 15, wherein said PCM is selected from the group consisting of germanium telluride ($Ge_XTe_Y$), germanium antimony telluride ($Ge_XSb_YTe_Z$), and any other chalcogenide.

19. The reduced parasitic capacitance RF switch of claim 15, wherein said heating element comprises a material selected from the group consisting of tungsten (W), molybdenum (Mo), titanium (Ti), titanium nitride (TiN), titanium tungsten (TiW), tantalum (Ta), nickel chromium (NiCr), and nickel chromium silicon (NiCrSi).

20. The reduced parasitic capacitance RF switch of claim 15, wherein a plurality of said $C_{OFF}$ RF switches are arranged in an array of RF switches, and wherein a corresponding plurality of said heating element routing interconnects are situated below said heating element, and a corresponding plurality of said PCM routing interconnects are situated above said heating element so as to achieve a further reduced $C_{OFF}$ for said array of RF switches.

* * * * *